(12) United States Patent
Shih et al.

(10) Patent No.: US 11,776,924 B2
(45) Date of Patent: Oct. 3, 2023

(54) METHOD OF MANUFACTURING SEMICONDUCTOR DEVICE

(71) Applicant: NANYA TECHNOLOGY CORPORATION, New Taipei (TW)

(72) Inventors: Chiang-Lin Shih, New Taipei (TW);
Pei-Jhen Wu, Taipei (TW);
Ching-Hung Chang, Taoyuan (TW);
Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/546,275

(22) Filed: Dec. 9, 2021

(65) Prior Publication Data
US 2022/0102302 A1    Mar. 31, 2022

Related U.S. Application Data

(62) Division of application No. 16/665,408, filed on Oct. 28, 2019, now Pat. No. 11,270,962.

(51) Int. Cl.
| | |
|---|---|
| *H01L 23/522* | (2006.01) |
| *H01L 23/00* | (2006.01) |
| *H01L 21/768* | (2006.01) |

(52) U.S. Cl.
CPC ........ *H01L 24/05* (2013.01); *H01L 21/76895* (2013.01); *H01L 23/5226* (2013.01); *H01L 24/03* (2013.01); *H01L 24/08* (2013.01); *H01L 24/80* (2013.01); *H01L 2224/039* (2013.01); *H01L 2224/05547* (2013.01); *H01L 2224/05556* (2013.01); *H01L 2224/05571* (2013.01); *H01L 2224/05647* (2013.01); *H01L 2224/08147* (2013.01); *H01L 2224/80895* (2013.01); *H01L 2224/80896* (2013.01)

(58) Field of Classification Search
CPC ............... H01L 24/05; H01L 21/76895; H01L 23/5226; H01L 24/08; H01L 24/03; H01L 2224/08147; H01L 2224/05647; H01L 2224/80895; H01L 2224/05556; H01L 2224/05571; H01L 2224/05547; H01L 2224/039; H01L 2224/80896; H01L 21/76807–76813; H01L 2221/1015–1036; H01L 23/522–53295; H01L 21/3205–32155; H01L 24/42
See application file for complete search history.

(56) References Cited

U.S. PATENT DOCUMENTS

| | | | |
|---|---|---|---|
| 2003/0013296 A1* | 1/2003 | Apelgren | .......... H01L 21/76802 438/639 |
| 2004/0094790 A1* | 5/2004 | Kanaya | ............. H01L 27/11502 257/300 |

(Continued)

*Primary Examiner* — Shahed Ahmed
(74) *Attorney, Agent, or Firm* — Xuan Zhang

(57) ABSTRACT

The present disclosure provides a method of manufacturing a semiconductor device. The method includes forming an interconnect layer on a semiconductor component, wherein the interconnect layer contains at least one metal pad electrically coupled to the semiconductor component; depositing an insulating layer on the interconnect layer; depositing a bonding dielectric on the insulating layer; and forming a re-routing layer penetrating through the bonding dielectric and the insulating layer and contacting the interconnect layer.

6 Claims, 12 Drawing Sheets

(56) References Cited

U.S. PATENT DOCUMENTS

| | | | |
|---|---|---|---|
| 2005/0133920 A1* | 6/2005 | Liou | H01L 21/76831 257/758 |
| 2009/0081864 A1* | 3/2009 | Matz | H01L 21/3148 438/637 |
| 2009/0289367 A1* | 11/2009 | Kodama | H01L 21/76832 257/751 |
| 2017/0005035 A1* | 1/2017 | Chen | H01L 23/3185 |
| 2018/0025974 A1* | 1/2018 | Basker | H01L 23/528 257/534 |
| 2019/0139861 A1* | 5/2019 | Kande | H01L 21/768 |

\* cited by examiner

METHOD OF MANUFACTURING SEMICONDUCTOR DEVICE

CROSS-REFERENCE TO RELATED APPLICATION

This application is a divisional application of U.S. Non-Provisional application Ser. No. 16/665,408 filed on Oct. 28, 2019, which is incorporated herein by reference in its entirety.

TECHNICAL FIELD

The present disclosure relates to a method of manufacturing a semiconductor device, and more particularly, to a method of manufacturing a semiconductor device including bonding structure.

DISCUSSION OF THE BACKGROUND

Semiconductor devices are used in a variety of electronic applications, such as personal computers, cell phones, digital cameras, and other electronic equipment. The fabrication of semiconductor devices involves sequentially depositing various material layers over a semiconductor substrate, and patterning the material layers using lithography and etching processes to form microelectronic components, including transistors, diodes, resistors and/or capacitors, on the semiconductor substrate.

The semiconductor industry continues to improve the integration density of the microelectronic components by continual reductions in minimum feature size, which allows more components to be integrated into a given area. Smaller package structures that occupy smaller footprints are developed to package the semiconductor devices. For example, in an attempt to further increase density of the semiconductor device, three-dimensional integrated circuits including stacking of two or more microelectronic components have been investigated.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a semiconductor component, a re-routing layer, a bonding dielectric and an insulating layer. The re-routing layer is disposed over the semiconductor component and electrically coupled to the semiconductor component. The bonding dielectric is disposed over the semiconductor component and encircles a top portion of the re-routing layer. The insulating layer is sandwiched between the semiconductor component and the bonding dielectric to surround a bottom portion of the re-routing layer.

In some embodiments, the bottom portion has a first width, and the top portion, integrated with the bottom portion, has a second width that is greater than the first width when viewed in a cross-sectional view.

In some embodiments, the first width gradually increases at positions of increasing distance from the semiconductor component.

In some embodiments, the insulating layer contacts the top portion.

In some embodiments, the bonding dielectric has a first thickness, and the insulating layer has a second thickness that is less than the first thickness.

In some embodiments, the insulating layer includes an underlying film over the semiconductor component and an overlying film between the underlying film and the bonding dielectric.

In some embodiments, the semiconductor device further includes an interconnect layer, containing at least one metallic pad, between the semiconductor component and the re-routing layer to electrically couple the semiconductor component and the re-routing layer, wherein the metal pad includes a material different from a material of the re-routing layer.

In some embodiments, the semiconductor device further includes a diffusion barrier layer between the bonding dielectric and the top portion and between the insulating layer and the bottom portion.

Another aspect of the present disclosure provides a method of manufacturing a semiconductor device. The method includes steps of forming an interconnect layer on a semiconductor component, wherein the interconnect layer contains at least one metal pad electrically coupled to the semiconductor component; depositing an insulating layer on the interconnect layer; depositing a bonding dielectric on the insulating layer; and forming a re-routing layer penetrating through the bonding dielectric and the insulating layer and contacting the interconnect layer.

In some embodiments, the forming of the re-routing layer includes steps of creating a first opening in the insulating layer to expose a portion of the metal pad; filling in the first opening simultaneously with the deposition of the bonding dielectric; creating a second opening in the bonding dielectric and recreating the first opening; and depositing a conductive material in the first opening and the second opening.

In some embodiments, the deposition of the conductive material in the first opening and the second opening includes steps of overfilling the first opening and the second opening with a copper-containing material, wherein the copper-containing material covers the bonding dielectric; and polishing the copper-containing material to expose a top surface of the bonding dielectric, wherein a top surface of the re-routing layer is coplanar with the top surface of the bonding dielectric after the polishing of the copper-containing material.

In some embodiments, a top surface of the insulating layer is exposed through the second opening.

In some embodiments, a remaining insulating layer is left after the removal of the regions of the insulating layer, and an included angle between the interconnect layer and sidewalls of the remaining insulating layer is greater than 90 degrees.

In some embodiments, the method further includes a step of performing a planarizing process to provide the bonding dielectric with a substantially planar top surface.

In some embodiments, the bonding dielectric is planarized from 5.5 μm to 3 μm.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
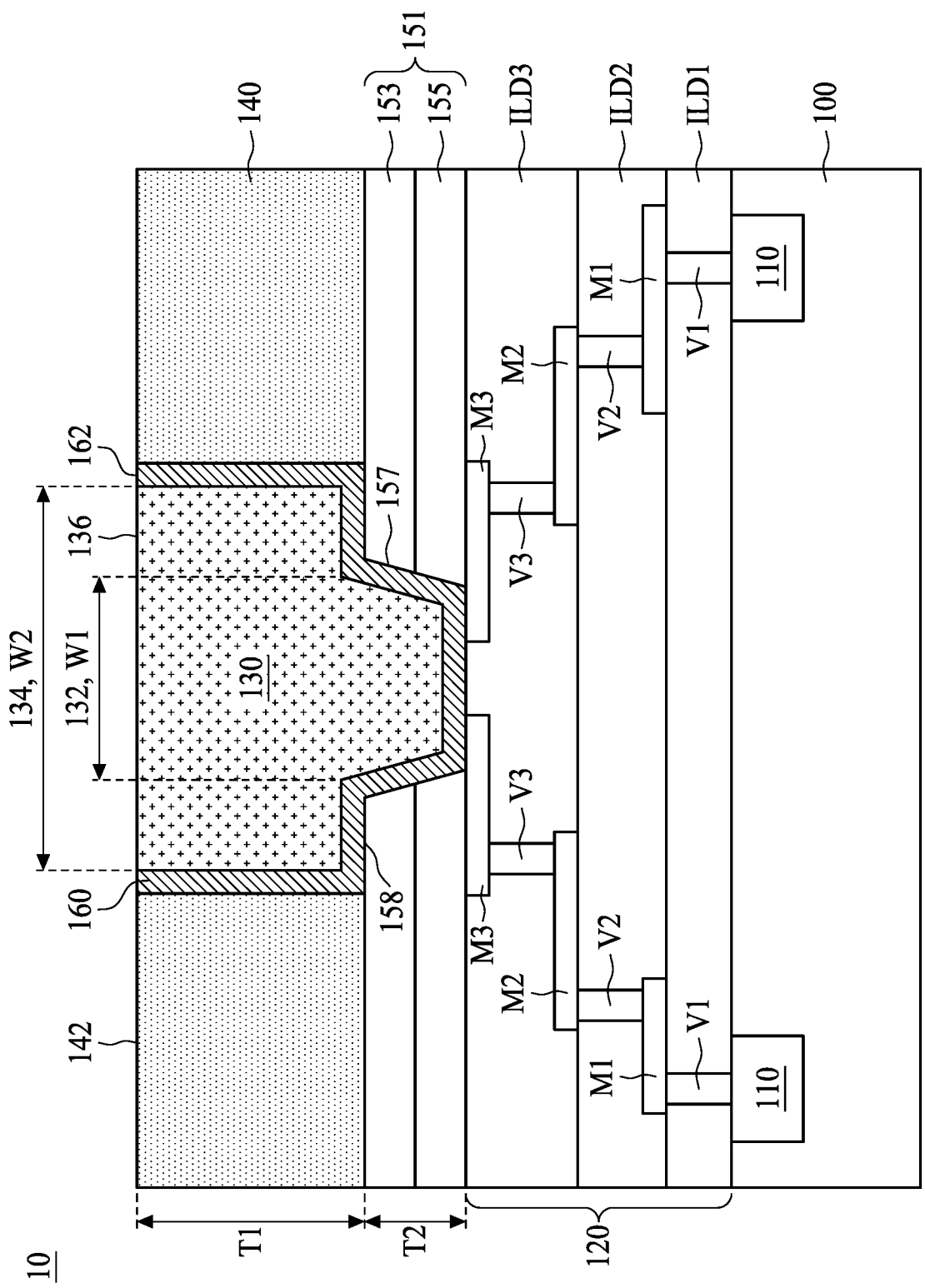
FIG. 1 is a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor device 10 in accordance with some embodiments of the present disclosure. Referring to FIG. 1, the semiconductor device 10 includes a substrate 100, one or more semiconductor components 110 in the substrate 100, an interconnect layer 120 disposed on the semiconductor components 110, a re-routing layer 130 in contact with the interconnect layer 120, a bonding dielectric 140 over the interconnect layer 120 and an insulating layer 151 between the interconnect layer 120 and the bonding dielectric 140 to surround the re-routing layer 130.

In some embodiments, the substrate 100 is a semiconductor substrate made of silicon. In alternative embodiments, the substrate 100 may include other semiconductor material such as III-V semiconductor materials. The semiconductor component 110 may include doped regions, isolation features and various layers that are not separately depicted and that combine to form various microelectronic elements, such as metal-oxide semiconductor (MOS) components.

The re-routing layer 130 is electrically coupled to the semiconductor component 110 through the interconnect layer 120 by methods including alternate stacking of metallic pads M1, M2, M3 and vias V1, V2, V3 embedded in dielectric materials ILD1, ILD2, ILD3. In some embodiments, the re-routing layer 130 includes a bottom portion 132 in direct contact with the interconnect layer 120 and surrounded by the insulating layer 151, and a top portion 134 integrated with the bottom portion 132 and surrounded by the bonding dielectric 140. In some embodiments, the bottom portion 132 has a first width W1 and the top portion 134 has a second width W2 greater than the first width W1 when viewed in a cross-sectional view. In some embodiments, the first width W1 gradually decreases at positions of decreasing distance from the semiconductor component 110, and the second width W2 is a substantially consistent width. In some embodiments, the insulating layer 150 contacts the top portion 134.

In some embodiments, the re-routing layer 130 made of copper-containing material is easy to diffuse; thus a diffusion barrier layer 160 is laid at least between the re-routing layer 130 and the bonding dielectric 140 and between the re-routing layer 130 and the insulating layer 151. The diffusion barrier layer 160 may also lie between the re-routing layer 130 and the interconnect layer 120. In some embodiments, a top surface 162 of the diffusion barrier layer 160 is level with a top surface 136 of the re-routing layer 130, which is coplanar with a top surface 142 of the bonding dielectric 140. Refractory metals (such as titanium or tantalum), refractory metal nitrides (such as titanium nitride or tantalum nitride), and refractory metal silicon nitrides (such as titanium silicon nitride or tantalum silicon nitride) are typically used for the diffusion barrier layer 160.

In exemplary embodiments, the bonding dielectric 140 above the insulating layer 151 includes a first thickness T1, and the insulating layer 151 has a second thickness T2 less than the first thickness T1. The insulating layer 150 has either a single-layer structure or a stacked-layer structure, and includes a silicon nitride film. In such embodiments, the insulating layer 151 includes an overlying film 153 of silicon nitride, contacting the bonding dielectric 140, and an underlying film 155 between the interconnect layer 120 and the overlying film 153. In some embodiments, the overlying film 153 may have an etching rate different from that of the underlying film 154 to create the substantially void-free bottom portion 132 of the re-routing layer 130. In some embodiments, the underlying film 155 includes oxide, such as silicon oxide.

In some embodiments, thicknesses of the overlying film 153 and the underlying film 155 may be modulated to terminate a dangling bond of silicon atoms at the interface of the substrate 100 and the underlying film 154 including silicon. In detail, dangling bonds of silicon atoms at the interface of the underlying film 154 of silicon oxide and the substrate 100 of silicon interface are bonded with and terminated by hydrogen atoms introduced in the overlying film 152 of silicon nitride. In some embodiments, the re-routing layer 130 and the bonding dielectric 140 serve as a bonding layer to facilitate a bonding with another semiconductor device 10.

Figure 2:
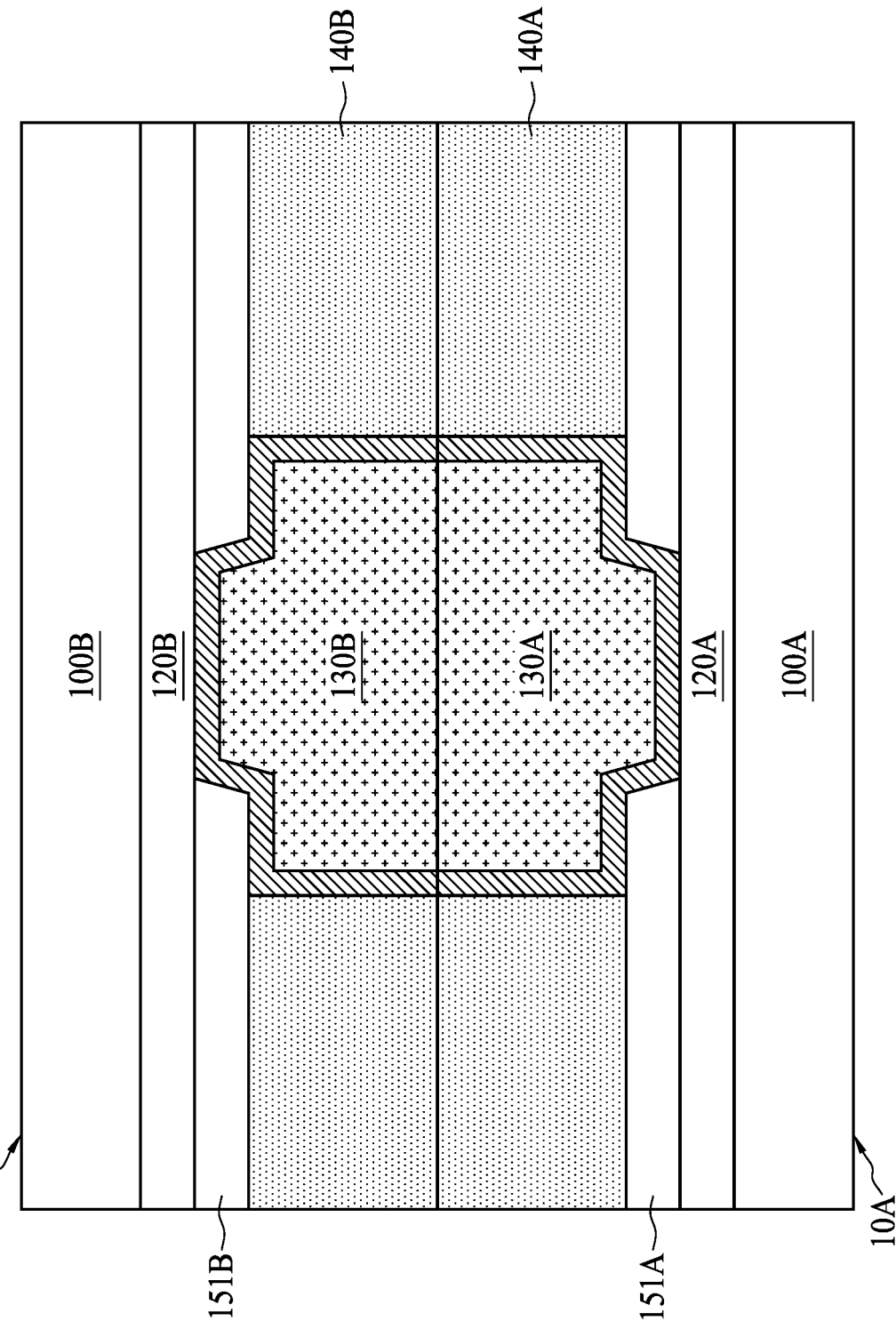
FIG. 2 is a cross-sectional view of a semiconductor device assembly in accordance with some embodiments of the present disclosure.

FIG. 2 is a cross-sectional view of a semiconductor device assembly 20 in accordance with some embodiments of the present disclosure. Referring to FIG. 2, the semiconductor device assembly 20 includes two semiconductor devices, including a first semiconductor device 10A and a second semiconductor device 10B, bonded together in a front-to-front configuration. The various layers of the first and second semiconductor devices 10A and 10B may be substantially similar to the layers of the semiconductor device 10 shown in FIG. 1, and detailed description of those layers is omitted for brevity.

In some embodiments, the second semiconductor device 10B is arranged upside down and stacked on the first semiconductor device 10A, and the second semiconductor device 10B is hybrid-bonded to the first semiconductor device 10A for making physical and electrical connection between the first semiconductor device 10A and the second semiconductor device 10B. Various processes may be used to bond the first semiconductor device 10A to the second semiconductor device 10B; in some embodiments, the processes for bonding the first semiconductor device 10A to the second semiconductor device 10B include a metal-to-metal bonding process and a dielectric-to-dielectric bonding process.

In some embodiments, the first and second semiconductor devices 10A and 10B are aligned to make a first re-routing layer 130A of the first semiconductor device 10A be in contact with a second re-routing layer 130B of the second semiconductor device 10B, and to make a bonding dielectric 140A of the first semiconductor device 10A contact the bonding dielectric 140B of the second semiconductor device 10B, wherein the second re-routing layer 130B includes substantially a same shape as the first re-routing layer 130A.

After the alignment of the first and second semiconductor devices 10A and 10B, heat and/or force are applied to bond the first re-routing layer 130A to the second re-routing layer 130B and to cure the first bonding dielectric 140A to the second bonding dielectric 140B, thereby forming the semiconductor device assembly 20.

Figure 3:
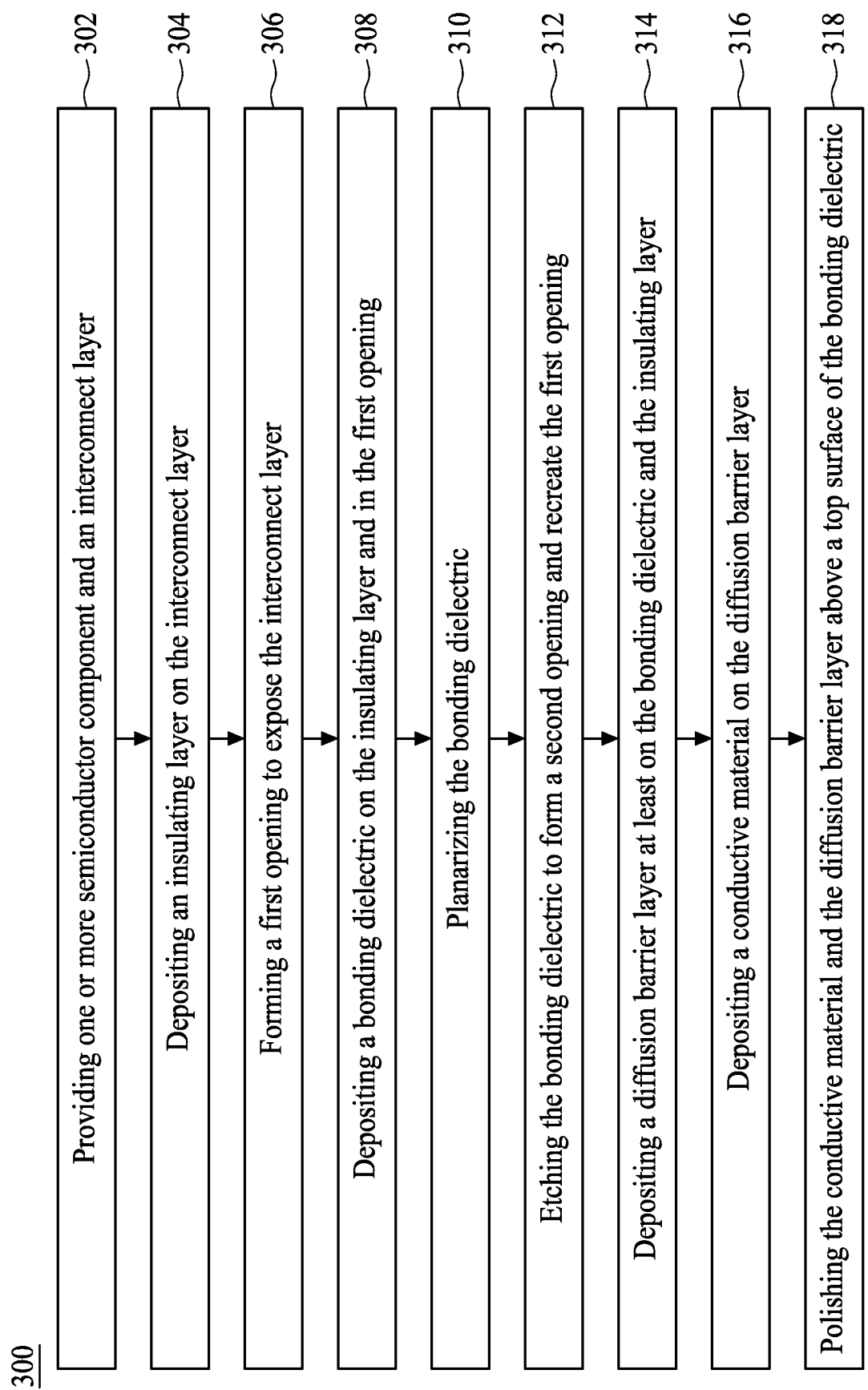
FIG. 3 is a flow diagram illustrating a method of manufacturing a semiconductor device in accordance with some embodiments of the present disclosure.

FIG. 3 is a flow diagram illustrating a method 300 of manufacturing a semiconductor device 100 in accordance with some embodiments of the present disclosure. FIGS. 4 to 12 are schematic diagrams illustrating various fabrication stages constructed according to the method 300 for manufacturing the semiconductor device 100 in accordance with some embodiments of the present disclosure. The stages shown in FIGS. 4 to 12 are also illustrated schematically in the flow diagram in FIG. 3. In the subsequent discussion, the fabrication stages shown in FIGS. 4 to 12 are discussed in reference to the process steps shown in FIG. 3.

Figure 4:
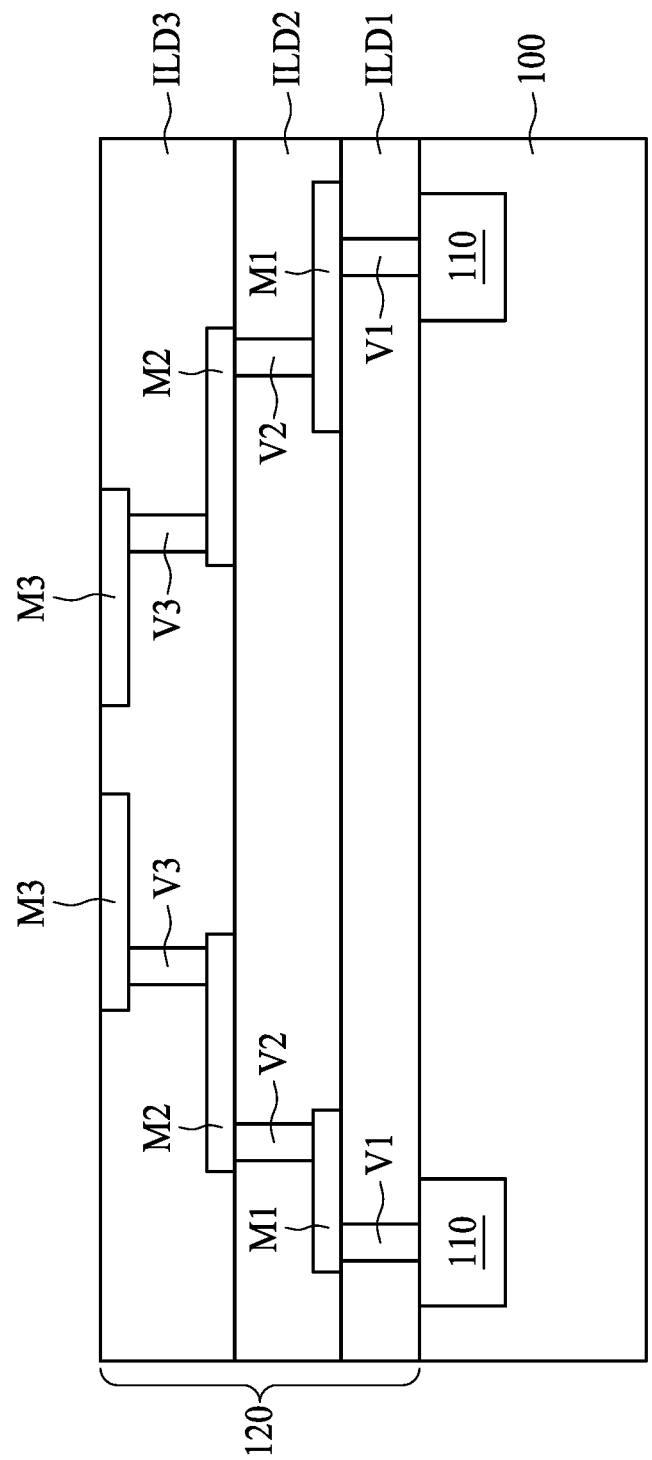
FIGS. 4 through 12 illustrate cross-sectional views of intermediate stages in the formation of a semiconductor device in accordance with some embodiments of the present disclosure.

Referring to FIG. 4, one or more semiconductor components 110 and an interconnect layer 120 are provided according to a step 302 in FIG. 3. The semiconductor components 110 may be formed in a semiconductor substrate 100 including silicon. In some embodiments, the semiconductor components 110 are formed using various processes including deposition, etching, implantation, photolithography, annealing, and/or other suitable processes. Moreover, the semiconductor components 110 may interconnect with one another (through the interconnect layer 120) to form, for example, a logic device, a memory device, an input/output device, a system-on-chip device, another suitable type of device, or a combination thereof. In some embodiments, the semiconductor components 110 may be formed in the semiconductor substrate 100 during front-end-of-line (FEOL) processes.

The interconnect layer 120, formed on the semiconductor component 110 and electrically coupled to the semiconductor component 110, includes alternatingly stacked metallic pads M1, M2, M3 and vias V1, V2, V3 embedded in dielectric materials ILD1, ILD2, ILD3. In such embodiment, the vias V1 contact the semiconductor components 110, and the metallic pads M3 farthest from the semiconductor components 110 are exposed through the dielectric material ILD3. In some embodiments, the metallic pads M1, M2, M3 may include aluminum or aluminum alloys. In some embodiments, the dielectric materials ILD1, ILD2, ILD3 include the same material or different materials. The dielectric materials ILD1, ILD2, ILD3 may include silicon oxide, silicon nitride, oxynitride, borosilicate glass (BSG), low-k material, another suitable material or a combination thereof. In some embodiments, the metallic pads M1, M2, M3 may be formed using plating process, the vias V1, V2, V3 may be formed using CVD processes, and the dielectric materials ILD1, ILD2, ILD3 may be formed using vapor deposition processes.

Figure 5:
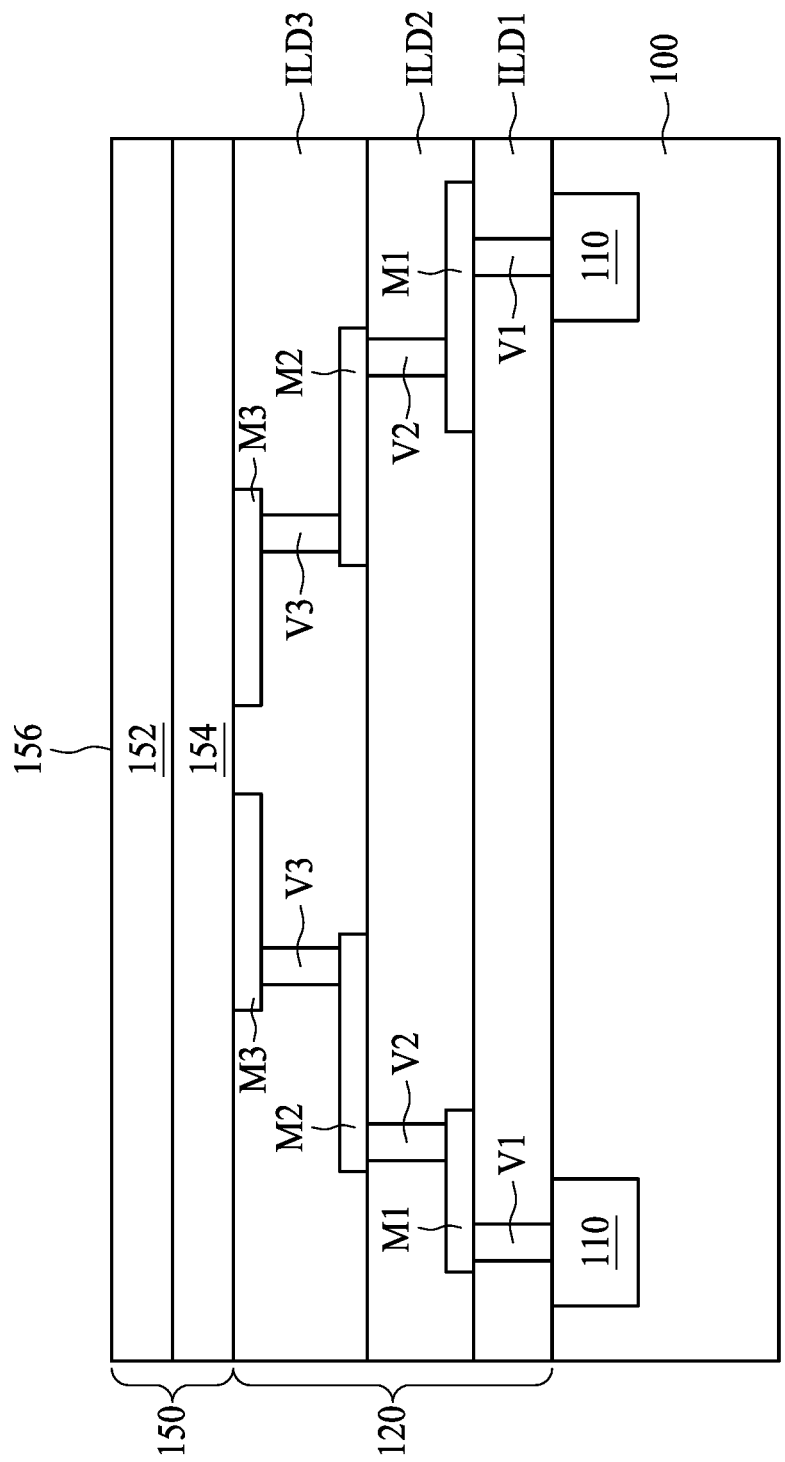

Referring to FIG. 5, in some embodiments, an insulating layer 150 is deposited on the interconnect layer 120 according to a step 304 in FIG. 3. In some embodiments, the deposition of the insulating layer 150 may include depositing a blanket underlying film 154, contacting the metallic pads M3 and the dielectric material ILD3 of the interconnect layer 120 farthest from the substrate 100, and depositing a blanket overlying film 152 on the blanket underlying film 154. In some embodiments, after the deposition of the blanket overlying film 152, a planarization process may be performed to provide the blanket overlying film 152 with a substantially planar top surface 156. In some embodiments, the blanket underlying film 154 and the blanket overlying film 152 are deposited by a low-pressure chemical vapor deposition (CVD) process or an atomic layer deposition (ALD) process. In alternative embodiments, the blanket underlying film 154 and the blanket overlying film 152 may be formed using vapor deposition processes. In some embodiments, the blanket underlying film 154 includes oxide, such as silicon dioxide. The blanket overlying film 152 may include nitride, such as silicon nitride, to provide the semiconductor device 100 with a uniform dangling bond configuration.

Figure 6:
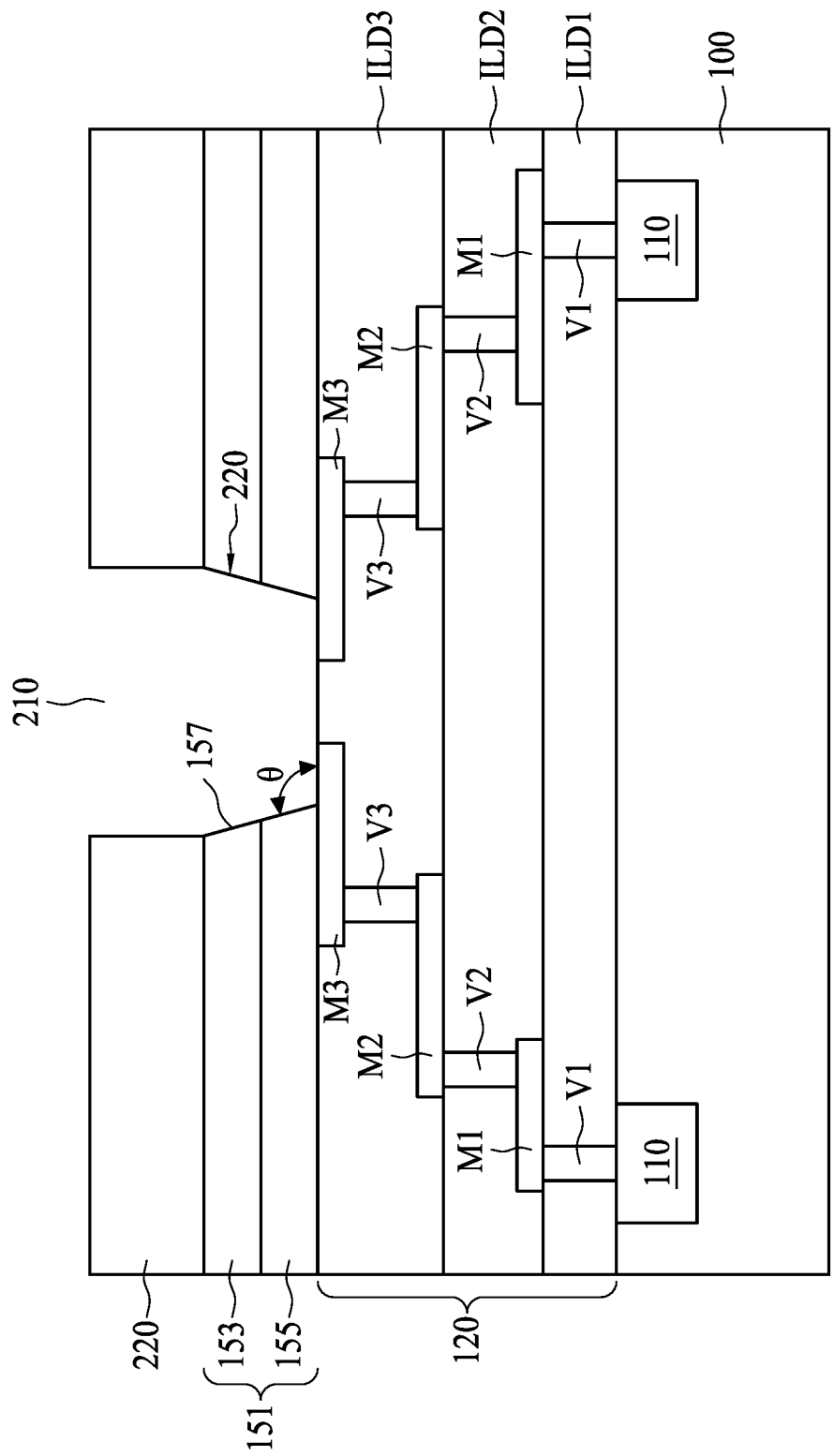

Referring to FIG. 6, in some embodiments, a first opening 210 is formed to expose the interconnect layer 120 according to a step 306 in FIG. 3. In some embodiments, the first opening 210 is formed by coating a first etching mask 220 on the blanket overlying film 152 shown in FIG. 5 and performing a first etching process to remove portions of the blanket overlying film 152 and the blanket underlying film 154 not protected by the first etching mask 220; accordingly, one or more portions of the metallic pads M3 are exposed through the first opening 210. In some embodiments, the first etching mask 220 is formed by performing an exposure process and a develop process on a first photoresist material fully covering the blanket overlying film 152. In some embodiments, the insulating layer 150 is etched to form a remaining insulating layer 151 using a dry etching process, an anisotropic wet etching process, or any other suitable anisotropic process, and the first etching process may utilize multiple etchants to etch the blanket overlying film 152 and the blanket underlying film 154, wherein the etchants are selected based on the materials being etched.

As shown in FIG. 6, the remaining insulating layer 151, including an overlying film 153 over the interconnect layer 120 and an underlying film 155 between the interconnect layer 120 and the overlying film 153, has sidewalls 157 exposed through the first opening 210. In some embodiments, an included angle θ between the sidewalls 157 and the interconnect layer 120 is greater than 90 degrees to create a void-free re-routing layer to be subsequently formed in the first opening 210. The first etching mask 220 is then removed, for example, by an ashing process or a wet strip process, wherein the wet strip process may chemically alter the first etching mask 220 so that it no longer adheres to the overlying layer 153.

Figure 7:
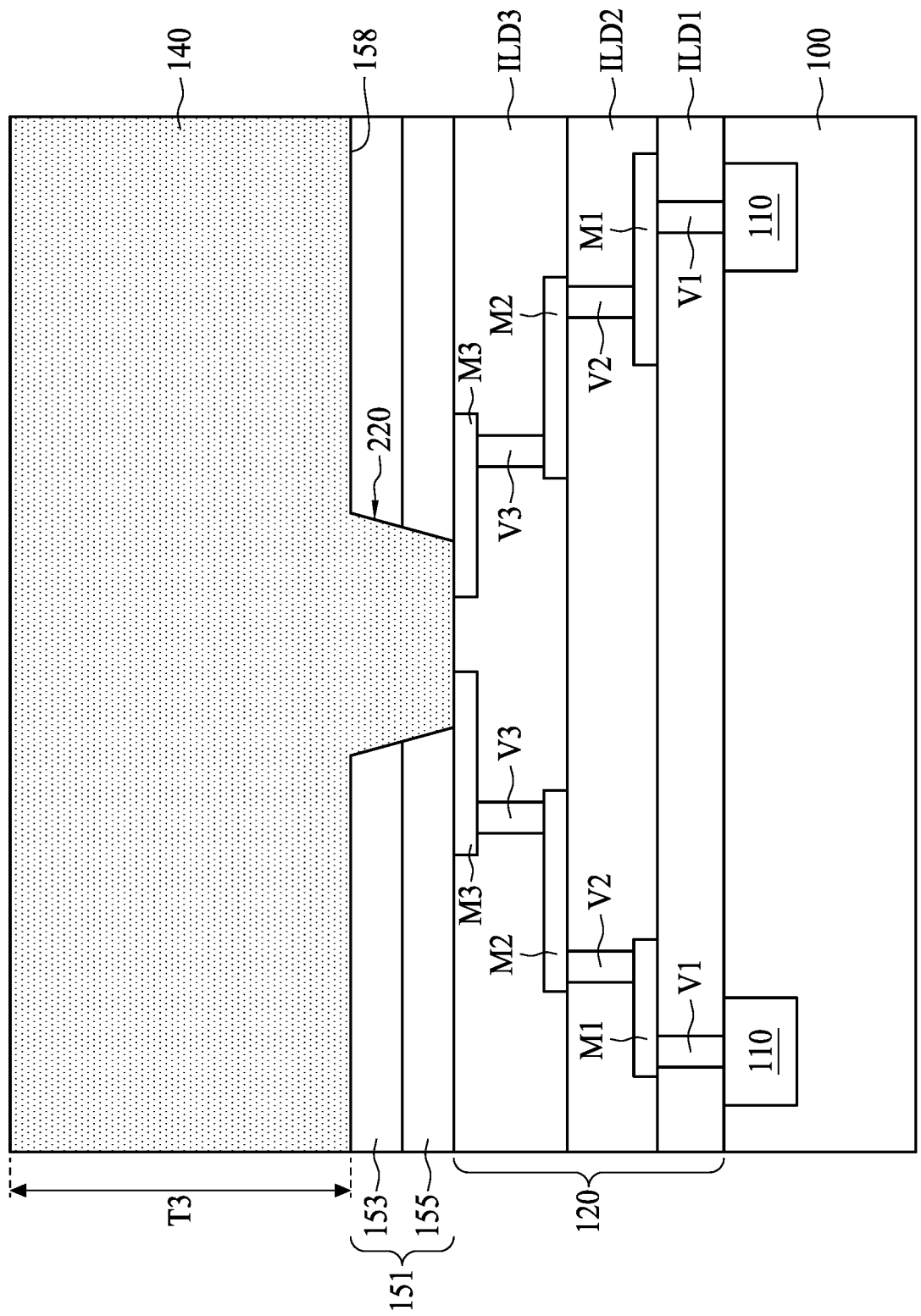

Referring to FIG. 7, after the first photoresist pattern 220 has been removed, a bonding dielectric 140 is deposited on a top surface 158 of the insulating layer 151 and in the first opening 210 according to a step 308 in FIG. 3. In some embodiments, the bonding dielectric 140 fills up the first opening 210. In some embodiments, after the deposition, the bonding dielectric 140 above the insulating layer 150 has an original thickness T3 of 5.5 μm.

Figure 8:
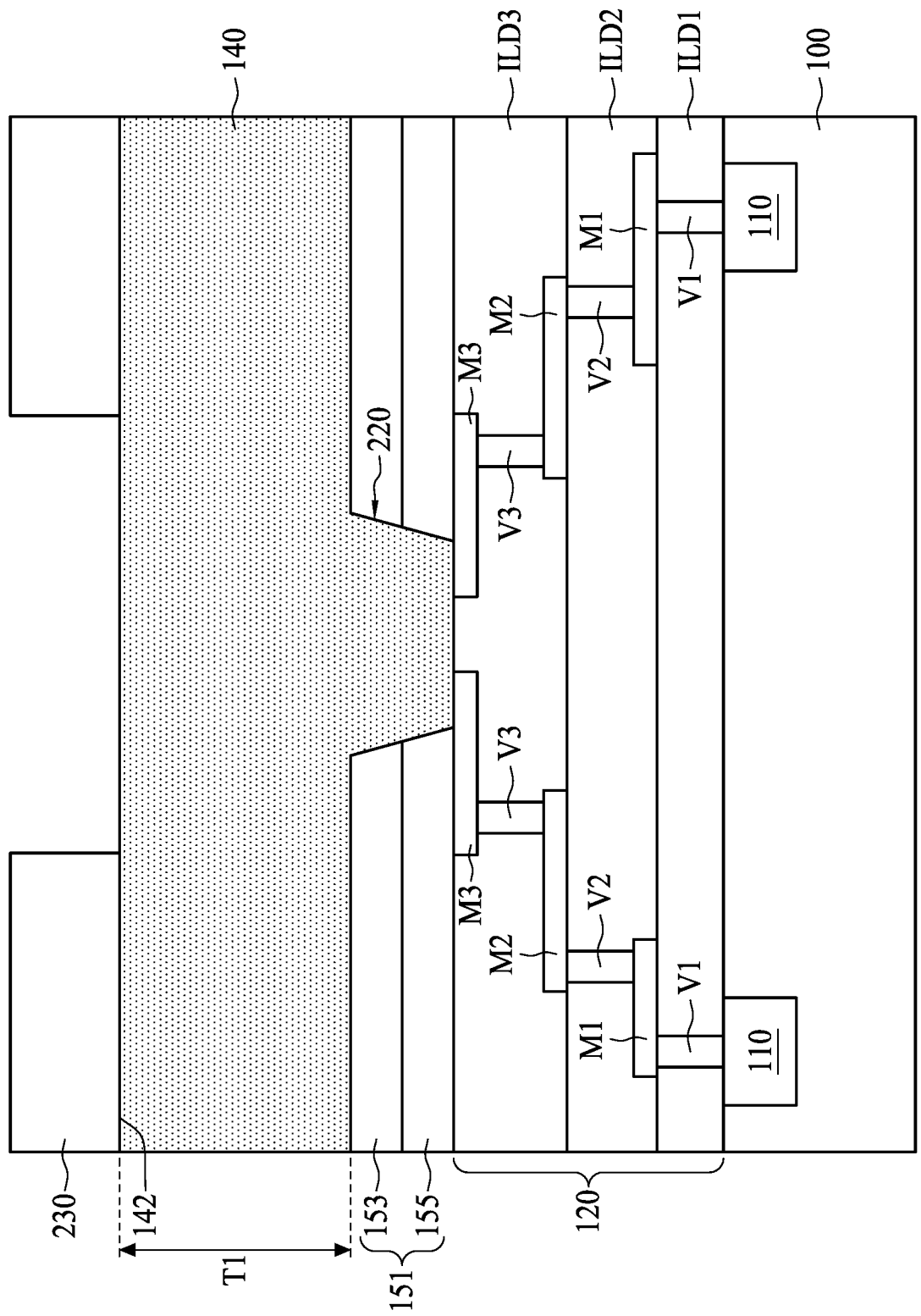

Referring to FIG. 8, the bonding dielectric 140 is planarized according to a step 310 in FIG. 3. In some embodiments, the bonding dielectric 140 is thinned to a thickness T1 of 3 μm. In some embodiments, after the planarization process, the bonding dielectric 140 has a substantially planar top surface 142. In some embodiments, the bonding dielectric 140 is planarized using a chemical mechanical polishing (CMP) process, for example. Following this, a second etching mask 230 is formed and patterned on the bonding dielectric 140.

Figure 9:
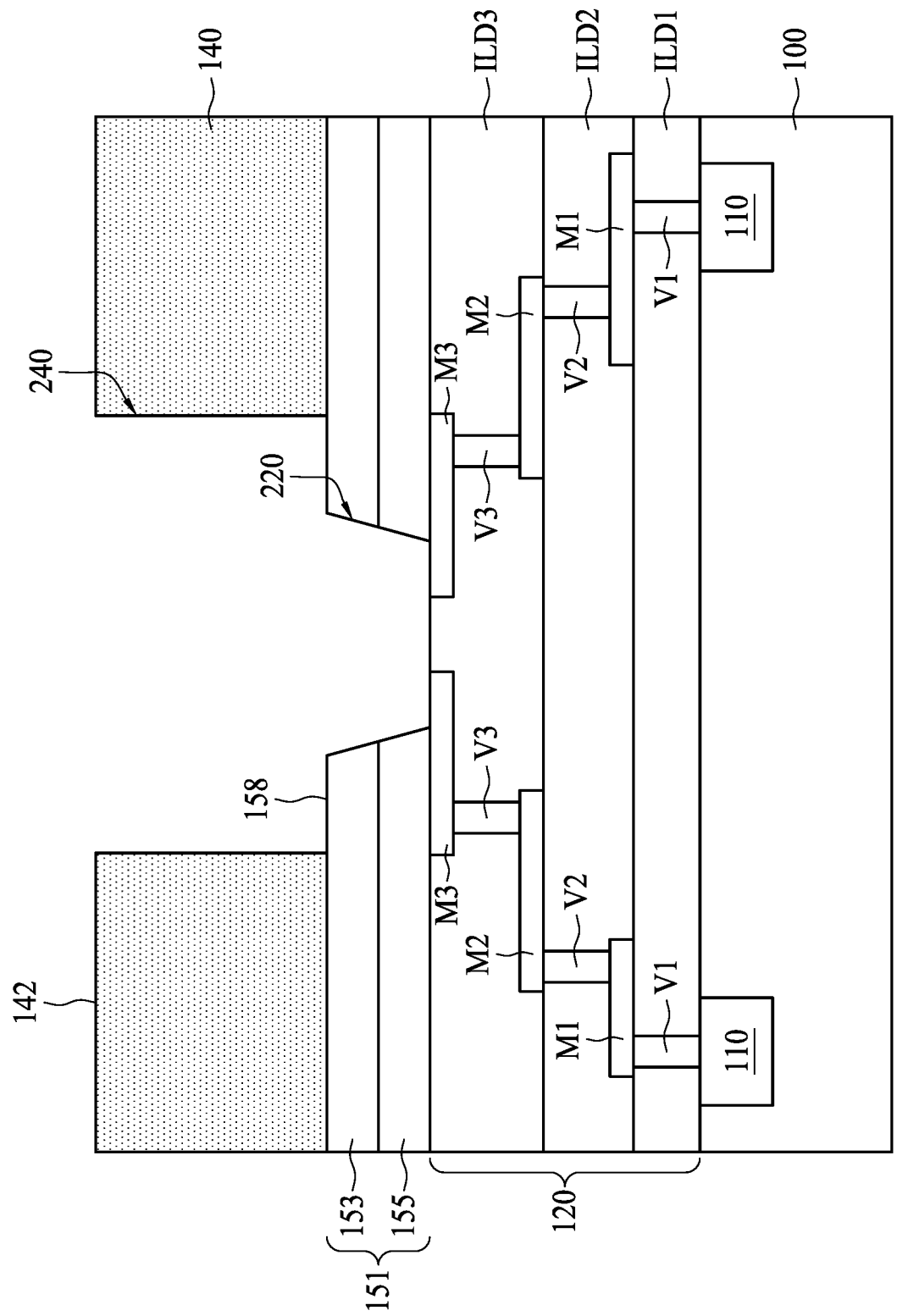

Referring to FIG. 9, in some embodiments, a second etching process is performed to remove regions of the bonding dielectric 140 according to a step 312 in FIG. 3. In some embodiments, the regions of the bonding dielectric 140 exposed through the second etching mask 230 are removed after the second etching process. The removal of the regions of the bonding dielectric 140 creates a second opening 240 in the bonding dielectric 140 and recreates the first opening 220 which, in turn, again exposes the portions of the metallic pads M3 and portions of the top surface 158 of the remaining insulating layer 151. The second opening 240 communicates with the first opening 220. The second etching mask 230 is then removed.

Figure 10:
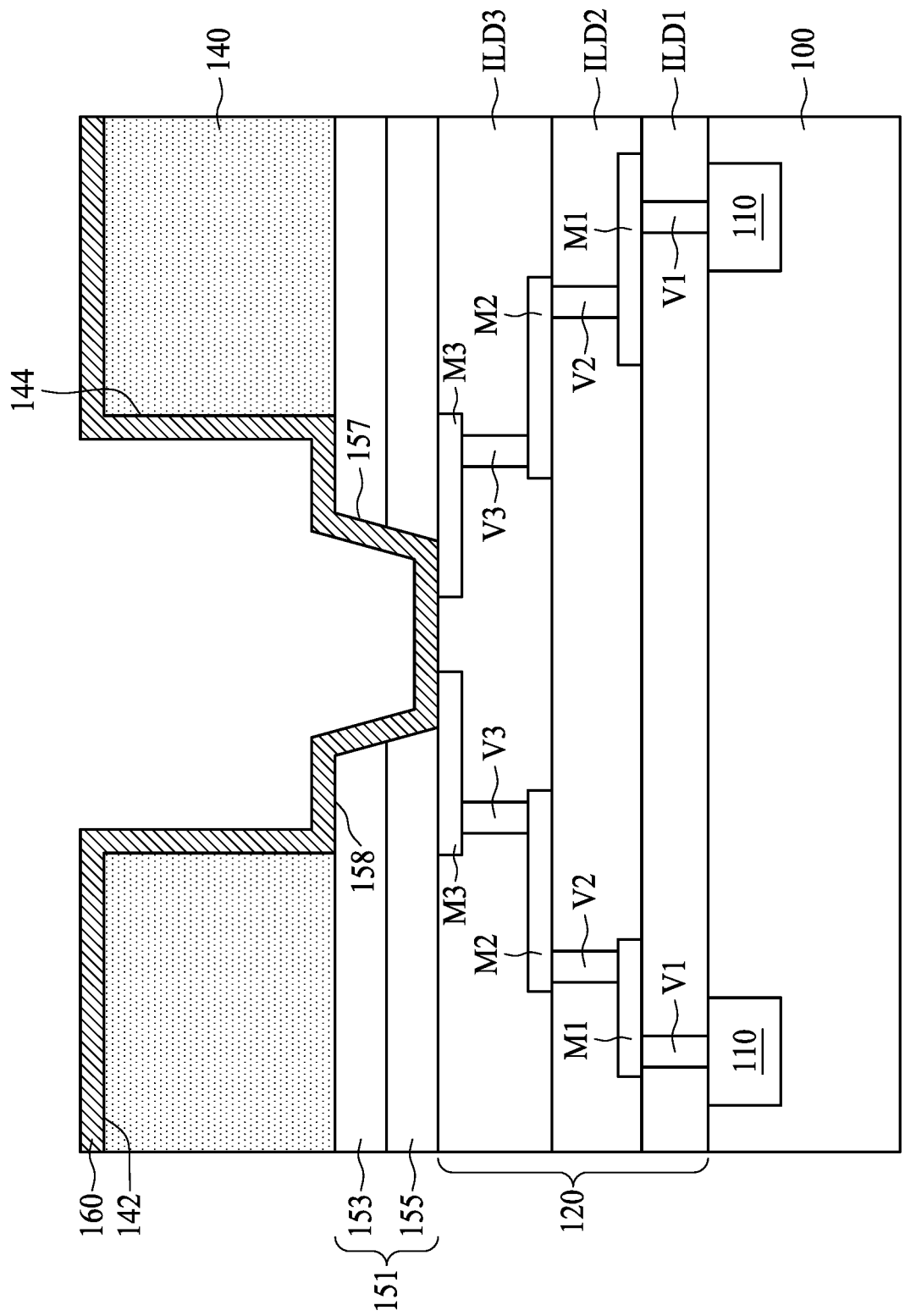

Referring to FIG. 10, in some embodiments, a diffusion barrier layer 160 is deposited on the top surface 142 of the bonding dielectric 140, on sidewalls 144 of the bonding dielectric 140, on the top surface 158 of the insulating layer 151, and on sidewalls 157 of the insulating layer 151 according to a step 314 in FIG. 3. In some embodiments, the diffusion barrier layer 160 is also deposited on the metallic pads M3 and the insulating material ILD3 of the interconnect layer 120. In some embodiments, the diffusion barrier layer 160, having a substantially uniform thickness, is formed using a physical vapor deposition (PVD) process, for example.

Figure 11:
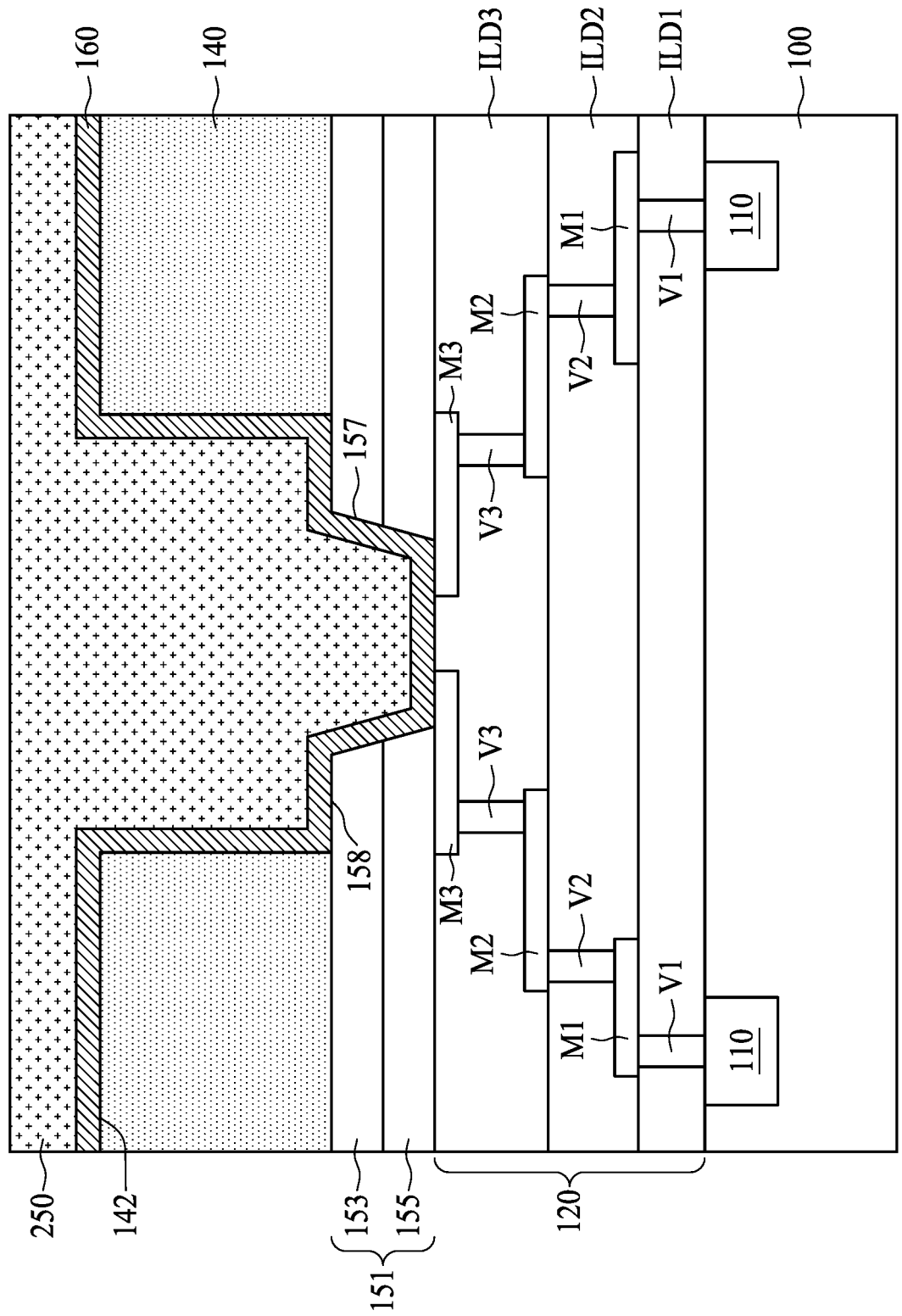

Referring to FIG. 11, in some embodiments, a conductive material 250 is deposited on the diffusion barrier layer 160 (and the metallic pads M3) according to a step 314 in FIG. 3. In some embodiments, the conductive material 250, which includes copper or copper alloys, not only fills up the first opening 220 and the second opening 240 but also covers the top surface 142 of the bonding dielectric 140. In some embodiments, the conductive material 250 is formed using a plating process.

Figure 12:
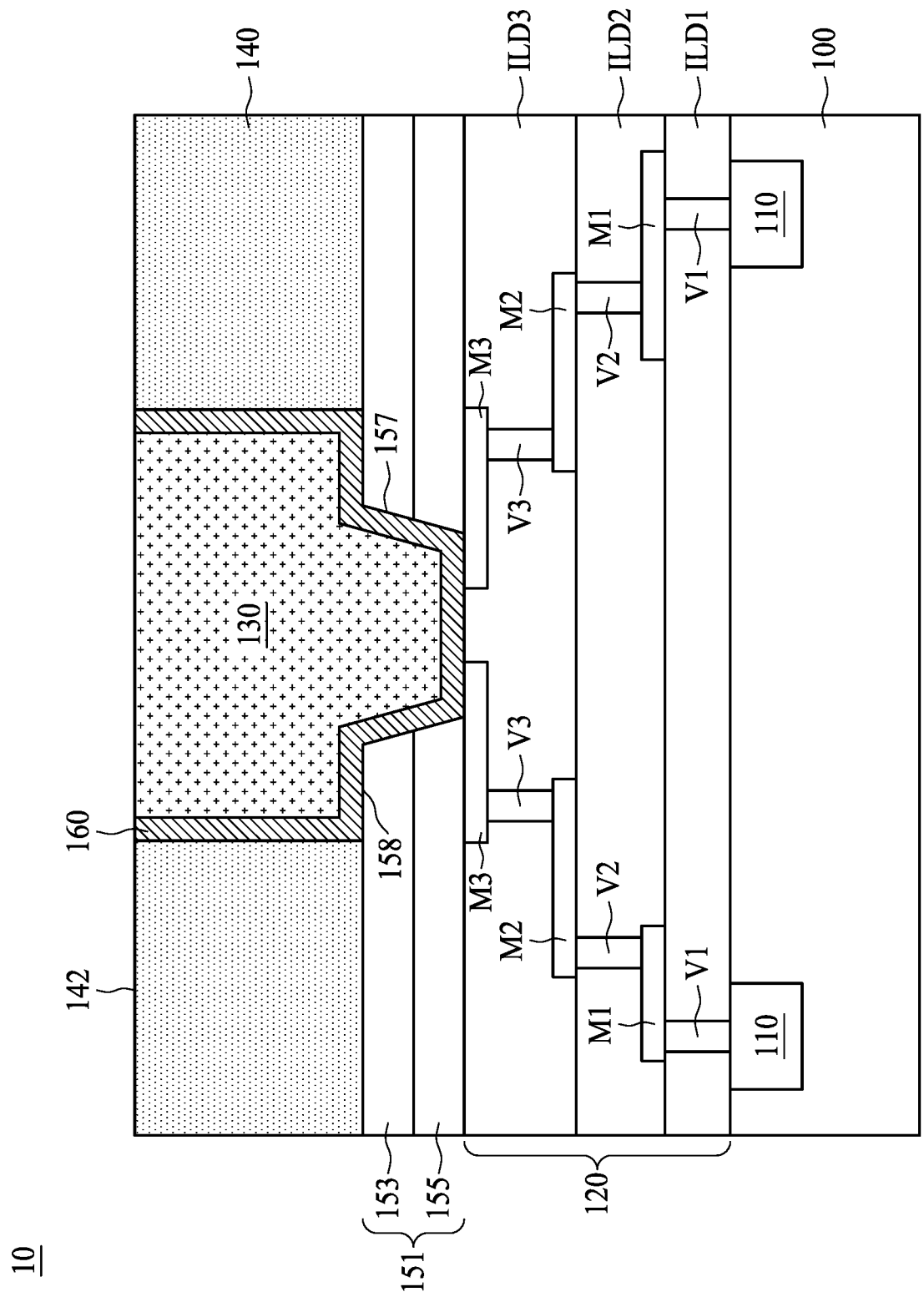

Referring to FIG. 12, in some embodiments, a polishing process is performed to remove the conductive material 250 and the diffusion barrier layer 160 from the top surface 142 of the bonding dielectric 140, thereby forming a re-routing layer 130. Accordingly, the semiconductor device 100 is completely formed.

One aspect of the present disclosure provides a semiconductor device. The semiconductor device includes a semiconductor component, a re-routing layer, a bonding dielectric and an insulating layer. The re-routing layer is disposed over the semiconductor component and electrically coupled to the semiconductor component. The bonding dielectric is disposed over the semiconductor component to surround a top portion of the re-routing layer. The insulating layer is disposed between the semiconductor component and the bonding dielectric to surround a bottom portion of the re-routing layer.

One aspect of the present disclosure provides a method of manufacturing a semiconductor device. The method includes steps of forming an interconnect layer on a semiconductor component, wherein the interconnect layer contains at least one metal pad electrically coupled to the semiconductor component; depositing an insulating layer on the interconnect layer; depositing a bonding dielectric on the insulating layer; and forming a re-routing layer penetrating through the bonding dielectric and the insulating layer and contacting the interconnect layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A method of manufacturing a semiconductor device, the method comprising:
forming an interconnect layer on a semiconductor component, wherein the interconnect layer contains at least one metal pad electrically coupled to the semiconductor component;
depositing an insulating layer on the interconnect layer;
depositing a bonding dielectric on the insulating layer; and forming a re-routing layer penetrating through the bonding dielectric and the insulating layer and contacting the interconnect layer;
wherein the forming of the re-routing layer comprises:
creating a first opening in the insulating layer to expose a portion of the metal pad;
filling in the first opening simultaneously with the deposition of the bonding dielectric;
creating a second opening in the bonding dielectric and recreating the first opening; and
depositing a conductive material in the first opening and the second opening.

2. The method of claim 1, wherein the deposition of the conductive material in the first opening and the second opening comprises:
overfilling the first opening and the second opening with a copper-containing conductive material, wherein the copper-containing conductive material covers the bonding dielectric; and
polishing the copper-containing material to expose a top surface of the bonding dielectric, wherein a top surface of the re-routing layer is coplanar with the top surface of the bonding dielectric after the polishing of the copper-containing conductive material.

3. The method of claim 1, wherein a top surface of the insulating layer is exposed through the second opening.

4. The method of claim 1, wherein a remaining insulating layer is left after the removal of the regions of the insulating layer, and an included angle between the interconnect layer and sidewalls of the remaining insulating layer is greater than 90 degrees.

5. The method of claim 1, further comprising performing a planarizing process to provide the bonding dielectric with a substantially planar top surface.

6. The method of claim 5, wherein the bonding dielectric is planarized from 5.5 μm to 3 μm.

* * * * *